United States Patent
Hawkins et al.

(10) Patent No.: US 9,138,784 B1
(45) Date of Patent: Sep. 22, 2015

(54) DEIONIZED WATER CONDITIONING SYSTEM AND METHODS

(75) Inventors: Jeffrey Alan Hawkins, Portland, OR (US); Charles Lorenzo Merrill, Portland, OR (US); Jason Daniel Marchetti, Tualatin, OR (US); Kousik Ganesan, Tualatin, OR (US); Bryan L. Buckalew, Tualatin, OR (US)

(73) Assignee: Novellus Systems, Inc., Fremont, CA (US)

( * ) Notice: Subject to any disclaimer, the term of this patent is extended or adjusted under 35 U.S.C. 154(b) by 229 days.

(21) Appl. No.: 12/961,274

(22) Filed: Dec. 6, 2010

Related U.S. Application Data

(60) Provisional application No. 61/287,978, filed on Dec. 18, 2009.

(51) Int. Cl.
- *B08B 3/00* (2006.01)
- *B08B 3/10* (2006.01)
- *B01D 19/00* (2006.01)

(52) U.S. Cl.
CPC .. *B08B 3/10* (2013.01); *B01D 19/00* (2013.01)

(58) Field of Classification Search
None
See application file for complete search history.

(56) References Cited

U.S. PATENT DOCUMENTS

| | | |
|---|---|---|
| 1,255,395 A | 2/1918 | Duram |
| 3,360,248 A * | 12/1967 | Lindeman et al. ............ 261/117 |
| 3,849,002 A | 11/1974 | Hach |
| 4,101,919 A | 7/1978 | Ammann |
| 4,229,191 A | 10/1980 | Moore |
| 4,297,217 A | 10/1981 | Hines et al. |
| 4,816,081 A | 3/1989 | Mehta et al. |
| 5,000,827 A | 3/1991 | Schuster et al. |
| 5,221,449 A | 6/1993 | Colgan et al. |
| 5,281,485 A | 1/1994 | Colgan et al. |
| 5,482,611 A | 1/1996 | Helmer et al. |
| 5,555,234 A | 9/1996 | Sugimoto |
| 5,800,626 A * | 9/1998 | Cohen et al. ................... 134/1.3 |

(Continued)

FOREIGN PATENT DOCUMENTS

| | | |
|---|---|---|
| EP | 0860866 A1 | 8/1998 |
| JP | 2006-004955 | 1/2006 |

(Continued)

OTHER PUBLICATIONS

U.S. Appl. No. 09/872,340, filed May 31, 2001, entitled "Methods and Apparatus for Bubble Removal in Wafer Wet Processing".

(Continued)

*Primary Examiner* — Eric Golightly
(74) *Attorney, Agent, or Firm* — Weaver Austin Villeneuve & Sampson LLP

(57) ABSTRACT

An apparatus for conditioning deionized water and delivering it to a semiconductor wafer in a post electrofill module includes a degassing station configured to remove dissolved gas from the deionized water flow, a heating station configured to heat the deionized water flow, and a nozzle configured to deliver the deionized water flow to the wafer. The heating and degassing are performed before the delivery of the deionized water flow to the wafer. In some implementations the degassing station includes a contact degasser or an inert gas bubbler, and the heating station is configured to heating the deionized water flow to a temperature of between about 35-40° C. In some embodiments the deionized water flow is passed through the degassing station before being passed through the heating station.

8 Claims, 11 Drawing Sheets

(56) References Cited

U.S. PATENT DOCUMENTS

| | | | |
|---|---|---|---|
| 5,831,727 A | 11/1998 | Stream | |
| 5,982,762 A | 11/1999 | Anzai et al. | |
| 5,985,762 A | 11/1999 | Geffken et al. | |
| 6,004,470 A | 12/1999 | Abril | |
| 6,017,437 A | 1/2000 | Ting et al. | |
| 6,074,544 A | 6/2000 | Reid et al. | |
| 6,099,702 A | 8/2000 | Reid et al. | |
| 6,110,346 A | 8/2000 | Reid et al. | |
| 6,124,203 A | 9/2000 | Joo et al. | |
| 6,126,798 A | 10/2000 | Reid et al. | |
| 6,139,712 A | 10/2000 | Patton et al. | |
| 6,156,167 A | 12/2000 | Patton et al. | |
| 6,159,354 A | 12/2000 | Contolini et al. | |
| 6,162,344 A | 12/2000 | Reid et al. | |
| 6,179,973 B1 | 1/2001 | Lai et al. | |
| 6,179,983 B1 | 1/2001 | Reid et al. | |
| 6,193,854 B1 | 2/2001 | Lai et al. | |
| 6,193,859 B1 | 2/2001 | Contolini et al. | |
| 6,217,716 B1 | 4/2001 | Fai Lai | |
| 6,221,757 B1 | 4/2001 | Schmidbauer et al. | |
| 6,251,242 B1 | 6/2001 | Fu et al. | |
| 6,261,433 B1 | 7/2001 | Landau | |
| 6,274,008 B1 | 8/2001 | Gopalraja et al. | |
| 6,277,249 B1 | 8/2001 | Gopalraja et al. | |
| 6,333,275 B1 | 12/2001 | Feng et al. | |
| 6,413,388 B1 | 7/2002 | Uzoh et al. | |
| 6,503,376 B2 | 1/2003 | Toyoda et al. | |
| 6,540,899 B2 | 4/2003 | Keigler | |
| 6,544,585 B1 | 4/2003 | Kuriyama et al. | |
| 6,551,487 B1 | 4/2003 | Reid et al. | |
| 6,582,578 B1 | 6/2003 | Dordi et al. | |
| 6,689,257 B2 | 2/2004 | Mishima et al. | |
| 6,800,187 B1 | 10/2004 | Reid et al. | |
| 6,964,792 B1 | 11/2005 | Mayer et al. | |
| 7,014,679 B2 | 3/2006 | Parekh et al. | |
| 7,097,410 B1 | 8/2006 | Reid et al. | |
| 7,670,950 B2 | 3/2010 | Richardson et al. | |
| 7,686,927 B1 | 3/2010 | Reid et al. | |
| 7,771,662 B2 | 8/2010 | Mayer et al. | |
| 8,404,095 B2 | 3/2013 | Perkins et al. | |
| 8,962,085 B2 | 2/2015 | Mayer et al. | |
| 2001/0035346 A1 | 11/2001 | Maeda | |
| 2002/0027080 A1 | 3/2002 | Yoshioka et al. | |
| 2002/0029973 A1 | 3/2002 | Maydan | |
| 2002/0084183 A1 | 7/2002 | Hanson et al. | |
| 2002/0084189 A1 | 7/2002 | Wang et al. | |
| 2002/0195352 A1 | 12/2002 | Mayer et al. | |
| 2004/0084315 A1 | 5/2004 | Mizohata et al. | |
| 2004/0188257 A1 | 9/2004 | Klocke et al. | |
| 2004/0198190 A1 | 10/2004 | Basol et al. | |
| 2004/0200725 A1 | 10/2004 | Yahalom et al. | |
| 2004/0262165 A1 | 12/2004 | Kanda et al. | |
| 2005/0026455 A1 | 2/2005 | Hamada et al. | |
| 2005/0255414 A1 | 11/2005 | Inabe et al. | |
| 2006/0102485 A1 | 5/2006 | Nakano et al. | |
| 2006/0141157 A1 | 6/2006 | Sekimoto et al. | |
| 2006/0266393 A1* | 11/2006 | Verhaverbeke et al. | 134/198 |
| 2008/0149487 A1 | 6/2008 | Lee | |
| 2008/0200018 A1 | 8/2008 | Kawamoto | |
| 2010/0084275 A1 | 4/2010 | Hanafusa | |
| 2010/0200960 A1 | 8/2010 | Angyal et al. | |
| 2010/0320081 A1 | 12/2010 | Mayer et al. | |
| 2010/0320609 A1 | 12/2010 | Mayer et al. | |
| 2011/0043239 A1 | 2/2011 | Tomita et al. | |
| 2011/0284386 A1 | 11/2011 | Willey et al. | |
| 2013/0171833 A1 | 7/2013 | Buckalew et al. | |
| 2014/0097088 A1 | 4/2014 | Stowell et al. | |
| 2014/0230860 A1 | 8/2014 | Chua et al. | |

FOREIGN PATENT DOCUMENTS

| | | |
|---|---|---|
| JP | 2007-138304 | 6/2007 |
| JP | 2009-064599 | 3/2009 |
| KR | 10-1999-0029433 | 4/1999 |
| KR | 10-2001-0052062 | 6/2001 |
| KR | 10-2004-0020882 | 3/2004 |
| TW | I281516 | 5/2007 |
| WO | WO 99/10566 | 3/1999 |
| WO | WO 99/41434 | 8/1999 |
| WO | WO 01/68952 | 9/2001 |
| WO | WO 02/062446 | 8/2002 |
| WO | WO 02/062466 | 8/2002 |
| WO | WO 2007/112768 | 10/2007 |
| WO | WO 2010/148147 | 12/2012 |

OTHER PUBLICATIONS

US Office Action, dated Aug. 31, 2005, issued in U.S. Appl. No. 09/872,340.
US Office Action, dated Apr. 14, 2005, issued in U.S. Appl. No. 09/872,340.
US Office Action, dated Jan. 18, 2006, issued in U.S. Appl. No. 09/872,340.
US Office Action, dated May 26, 2006, issued in U.S. Appl. No. 09/872,340.
US Office Action, dated Nov. 8, 2006, issued in U.S. Appl. No. 09/872,340.
US Final Office Action, dated Mar. 14, 2007, issued in U.S. Appl. No. 09/872,340.
US Office Action, dated Jun. 27, 2012 in U.S. Appl. No. 12/684,787.
US Office Action, dated Apr. 8, 2013 in U.S. Appl. No. 12/684,787.
US Final Office Action, dated Jul. 24, 2013 in U.S. Appl. No. 12/684,787.
US Office Action, dated Apr. 12, 2011, issued in U.S. Appl. No. 12/684,792.
US Final Office Action, dated Jul. 26, 2011, issued in U.S. Appl. No. 12/684,792.
PCT International Search Report and Witten Opinion, dated Jan. 5, 2011, issued in PCT/US2010/038901.
PCT International Preliminary Report on Patentability and Written Opinion dated Jan. 5, 2012, issued in PCT/US2010/038901.
KR Office Action, dated Jan. 5, 2012 in KR Application No. 2010-7026340.
KR Decision to Grant, dated Feb. 21, 2013 in KR Application No. 2010-7026340.
U.S. Appl. No. 14/102,239, filed Dec. 10, 2013, entitled "Electrofill Vacuum Plating Cell".
U.S. Appl. No. 14/085,262, filed Nov. 20, 2013, entitled "Alkaline Pretreatment for Electroplating".
U.S. Appl. No. 13/460,423, filed Apr. 30, 2012, titled "Wetting Wave Front Control for Reduced Air Entrapment During Wafer Entry Into Electroplating Bath.".
US Office Action, dated Oct. 29, 2013 in U.S. Appl. No. 12/684,787.
US Office Action, dated Sep. 27, 2013, issued in U.S. Appl. No. 12/684,792.
U.S. Appl. No. 14/326,899, filed Jul. 9, 2014, entitled "Apparatus for Wetting Pretreatment for Enhanced Damascene Metal Filling".
US Final Office Action, dated Mar. 3, 2014 in U.S. Appl. No. 12/684,787.
US Office Action, dated Aug. 26, 2014 in U.S. Appl. No. 12/684,787.
US Notice of Allowance, dated Oct. 10, 2014 in U.S. Appl. No. 12/684,787.
US Final Office Action, dated Apr. 10, 2014, issued in U.S. Appl. No. 12/684,792.
Chinese Office Action dated Aug. 8, 2014 issued in CN Application No. 201080026847.7.
U.S. Appl. No. 14/613,306, filed Feb. 3, 2015, entitled "Geometry and Process Optimization for Ultra-High RPM Plating".
U.S. Appl. No. 14/593,676, filed Jan. 9, 2015, entitled "Wetting Pretreatment for Enhanced Damascene Metal Filling".
US Notice of Allowance (Supplemental Notice of Allowability), dated Oct. 22, 2014 in U.S. Appl. No. 12/684,787.
US Notice of Allowance (Supplemental Notice of Allowability), dated Oct. 28, 2014 in U.S. Appl. No. 12/684,787.
Taiwan Office Action dated Nov. 18, 2014 issued in TW Application No. 099119625.

* cited by examiner

TOP VIEW

SIDE VIEW

BOTTOM VIEW

DEIONIZED WATER CONDITIONING SYSTEM AND METHODS

CROSS-REFERENCE TO RELATED APPLICATIONS

This application claims the benefit of and priority to U.S. Provisional Application Ser. No. 61/287,978 filed Dec. 18, 2009, the contents of which are incorporated herein by reference in their entirety and for all purposes.

FIELD OF INVENTION

The invention generally relates to a conditioning system for deionized water. In a more specific sense the invention relates to a conditioning system for deionized water, and related methods, used in semiconductor fabrication processes.

BACKGROUND

Damascene processing is a method for forming metal lines on integrated circuits. It is often a preferred method because it requires fewer processing steps than other methods and offers a higher yield. In Damascene processing, as well as other integrated circuit manufacturing processes, the conductive routes on the surface of the circuit are generally formed out of a common metal, traditionally aluminum. Copper is a favored metal because of its higher conductivity and electromigration resistance when compared to aluminum, but copper presents special challenges because it readily diffuses into silicon oxide and reduces its electrical resistance at very low doping levels.

During integrated circuit fabrication, conductive metal is needed on the active circuit region of the wafer, i.e., the main interior region on the front side, but is undesirable elsewhere. In a typical copper Damascene process, the formation of the desired conductive routes generally begins with a thin physical vapor deposition (PVD) of the metal, followed by a thicker electrofill layer (which is formed by electroplating). The PVD process is typically sputtering. In order to maximize the size of the wafer's useable area (sometimes referred to herein as the "active surface region") and thereby maximize the number of integrated circuits produced per wafer), the electrofilled metal must be deposited to very near the edge of the semiconductor wafer. Thus, it is necessary to allow physical vapor deposition of the metal over the entire front side of the wafer. As a byproduct of this process step, PVD metal typically coats the front edge area outside the active circuit region, as well as the side edge, and to some degree, the backside. Electrofill of the metal is much easier to control, since the electroplating apparatus can be designed to exclude the electroplating solution from undesired areas such as the edge and backside of the wafer. One example of plating apparatus that constrains electroplating solution to the wafer active surface is the SABRE™ clamshell electroplating apparatus available from Novellus Systems, Inc. of San Jose, Calif. and described, for example, in U.S. Pat. No. 6,800,187, "CLAMSHELL APPARATUS FOR ELECTROCHEMICALLY TREATING SEMICONDUCTOR WAFERS" naming Jonathan Reid et al. as inventors, and filed Aug. 10, 2001, which is herein incorporated by reference in its entirety for all purposes.

The PVD metal remaining on the wafer edge after electrofill is undesirable for various reasons. One reason is that PVD metal layers are thin and tend to flake off during subsequent handling, thus generating undesirable particles. This can be understood as follows. At the front side edge of the wafer, the wafer surface is beveled. Here the PVD layers are not only thin, but also unevenly deposited. Thus, they do not adhere well. Adhesion of subsequent dielectric layers onto such thin metal is also poor, thus introducing the possibility of even more particle generation. By contrast the PVD metal on the active interior region of the wafer is simply covered with thick, even electrofill metal which is eventually planarized by CMP down to the dielectric. This flat surface, which is mostly dielectric, is then covered with a barrier layer substance such as SiN that both adheres well to the dielectric and aids in the adhesion of subsequent layers. Another reason to remove the residual PVD metal layers in the wafer edge area is that the barrier layers underneath them are also thin and uneven, which may allow migration of the metal into the dielectric. This problem is especially important when the metal is copper.

To address these problems, semiconductor equipment may have to allow etching of the unwanted residual metal layers. Depending upon the type of metal to be removed and the characteristics of the etching system, some liquid etchant compositions are appropriate and others are not. In general, the liquid etchant should etch the unwanted metal rapidly at room temperature. But, it should not aggressively attack the mechanical and electrical components of the etch system. In addition, it should not liberate dangerous, gaseous by-products during the etching reaction. For example, nitric acid should be avoided because it liberates nitric oxide during reaction with copper. Still further, the components of the liquid etchant should include only those materials readily available in normal integrated circuit manufacturing facilities (FAB's), for example, a deionized water flow and reagents such as sulfuric acid and hydrogen peroxide.

Apparatus for processing wafers, for example, removing unwanted metal, are typically called a "post-electrofill module" (PEM). Examples of PEM's include "EBR modules" which are specifically designed to carry out the edge bevel removal (EBR) process, as well as a backside etch (BSE) process. Post electrofill processes often require an available flow of high purity deionized water. This high purity water is used as a solvent both to prepare etchant solutions as well as to rinse wafers, sometimes both before and after an etch step. One problem associated with post-electrofill processes is limited throughput associated with, for example, the time required to etch, acid wash, rinse and dry wafers in post-electrofill processing. Etchants take time to remove the desired amount of metal, deionized rinse steps require sufficient time to remove used etchant or acid wash, and it takes time to dry the wafer properly when needed as part of a post-electrofill process.

Another issue associated with post-electrofill processing is the amount of solvents or reagents used to effectively carry out each process step. Using highly purified solvents and reagents is expensive, so any steps taken to minimize this usage reduce the overall cost of the circuits made from each silicon wafer.

In view of these considerations, what is needed are methods and apparatus that decrease time required, and the amount of solvents and reagents used for post-electrofill processes that use deionized water. The present invention addresses these concerns.

SUMMARY

The present invention provides improved methods and apparatus that decrease time required, and the amount of solvents and reagents used, for post-electrofill processes that use deionized water. A deionized water flow, for example, from a semiconductor FAB, is conditioned prior to post electrofill processing in order to improve post electrofill processing throughput and reduce waste thereby saving money.

One aspect of the invention is an apparatus for conditioning a deionized water flow, including a degassing station configured to remove dissolved gas from the deionized water flow; a heating station configured to heat the deionized water flow, and a nozzle configured to deliver the conditioned water flow to a wafer. The degassing station may include a contactor and/or an inert gas bubbler. In one configuration, the deionized water flow is passed through the degassing station before being passed through the heating station. In one embodiment, the degassed deionized (unheated) water can pass directly from the degasser for use in preparing reagents used in one or more dilution modules in a PEM. In embodiments where the degassed water also passes through the heating station, the heating station delivers the degassed heated deionized water flow at a temperature of between about 30° C. and about 80° C. for use in wafer processing. Processing in this sense includes rinse steps and use as a solvent for preparing post electrofill processing solutions, for example, etchants and the like, in one or more dilution modules. The mixing stations can also be configured to receive deionized degassed heated water from the heating station and deliver a flow of substantially constant temperature water to a PEM. The heater can include one or more inline heaters, in series and/or parallel, recirculation heaters, tank heaters and the like. The deionized water flow is maintained at a pressure of between about 40 psig and about 80 psig.

In some embodiments, apparatus described herein may include various valve manifolds to direct the conditioned deionized water flow to, for example, the front and back of the wafer, recirculate the deionized water flow, divert the deionized water flow to a drain or back to the FAB and provide backpressure to maintain desired pressure levels in the PEM. Thus, in another aspect of the invention, the apparatus described above may further include: (i) a first valve manifold configured to deliver the deionized water flow to a first plurality of spray heads via a first plurality of valves, when said first plurality of valves are open; (ii) a second valve manifold configured to deliver the deionized water flow to a second plurality of spray heads via a second plurality of valves, when said second plurality of valves are open; and (iii) a third valve manifold comprising a third plurality of valves, the third valve manifold configured to provide a pressure feedback control to at least one of the first valve manifold and the second valve manifold, and deliver the deionized water flow to a return line for recirculation to the FAB.

In one embodiment, pressure feedback control is provided via slaving the third plurality of valves to the first plurality of valves and the second plurality of valves, whereby the third plurality of valves are closed when the first plurality of valves and/or the second plurality of valves are open.

In another embodiment, apparatus further include a diverter valve manifold, downstream of the first valve manifold configured to drain the deionized water flow in order to maintain the temperature of the deionized water remaining in the apparatus for delivery to one or more spray heads.

Another aspect of the invention is a method of conditioning a deionized water flow for use in post electrofill processing, the method including (i) degassing the deionized water flow; and (ii) heating the deionized water flow. The conditioned deionized water speeds process time including etching, rinsing, drying and the like. The deionized water flow may be heated or degassed first. In one embodiment the deionized water flow is first degassed and then heated prior to application in post electrofill processes. The heating, pressure and other process parameters are consistent with those outlined above for apparatus described herein. Depending on the need, the deionized water flow may be passed through a volume serving as a mixing tank to ensure uniform temperature prior to use, for example, in a PEM. The deionized water flow is delivered to the front side, the back side, or both the front side and the back side of the wafer concurrently. During periods when the conditioned deionized water is not currently being used for processing, the deionized water flow is recirculated in a recirculation loop or diverted momentarily to a drain to maintain the temperature of the deionized water flow just prior to application to the wafer.

These and other features and advantages of the present invention will be described in more detail below with reference to the associated drawings.

DETAILED DESCRIPTION

In the following detailed description of the present invention, numerous specific embodiments are set forth in order to provide a thorough understanding of the invention. However, as will be apparent to those skilled in the art, the present invention may be practiced without these specific details or by using alternate elements or processes. In other instances well-known processes, procedures and components have not been described in detail so as not to unnecessarily obscure aspects of the present invention. For example, power supplies, valve manifolds, heaters, vacuum pumps etc. as described herein can be connected to a system controller, for example, an appropriately programmed computer, which includes program instructions for carrying out various operations such as heating, operating valves, turning on vacuum systems, coordinating process operations with a PEM, and the like, for example, based on feedback from pressure sensors, temperature sensors, flow sensors, user input and the like. One of ordinary skill in the art would appreciate that such control mechanisms are intended to be part of the invention, while not necessarily described in detail so as not to obscure the salient features of the invention.

As indicated, this invention pertains to improved post electrofill processing. One valuable electrofill process is copper deposition to form copper interconnects. In many typical copper electrofill methods, there is at least some unwanted copper deposited on the wafer. For example, removal of unwanted copper metal from an edge bevel region of a semiconductor wafer. A "semiconductor wafer" as referred to in this invention is a semiconductor substrate at any of the various states of manufacture in the production of integrated circuits. One standard semiconductor wafer described in this invention is 200 mm in diameter, 0.75 mm thick, with an approximate radius of curvature on the front and backside edges of about 0.15 millimeters (see SEMI Specification M1-0298). Of course, semiconductor wafers of other dimensions, such as a standard 300 mm diameter silicon wafers, can also be processed in accordance with this invention. Note that standard specifications for a 300 mm diameter wafer may be found in SEMI Specification M1-0707.

Figure 1:
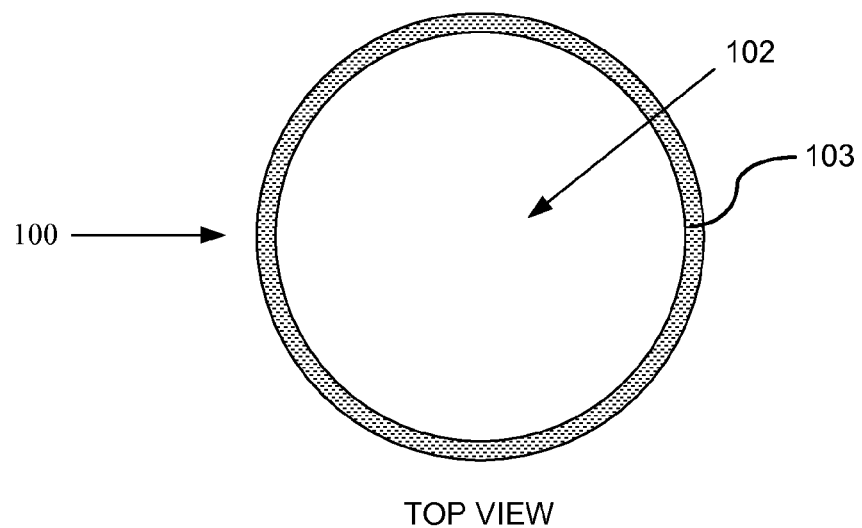
FIG. 1 is an illustration of a semiconductor wafer showing surfaces that are subjected to post electrofill processing in accordance with the invention.
Figure 1:
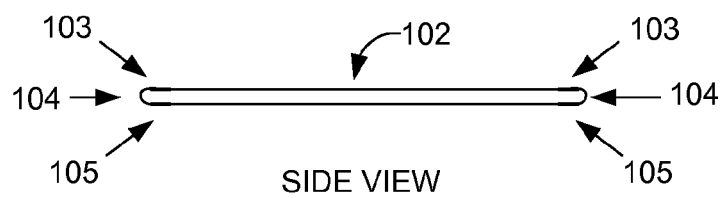
Figure 1:
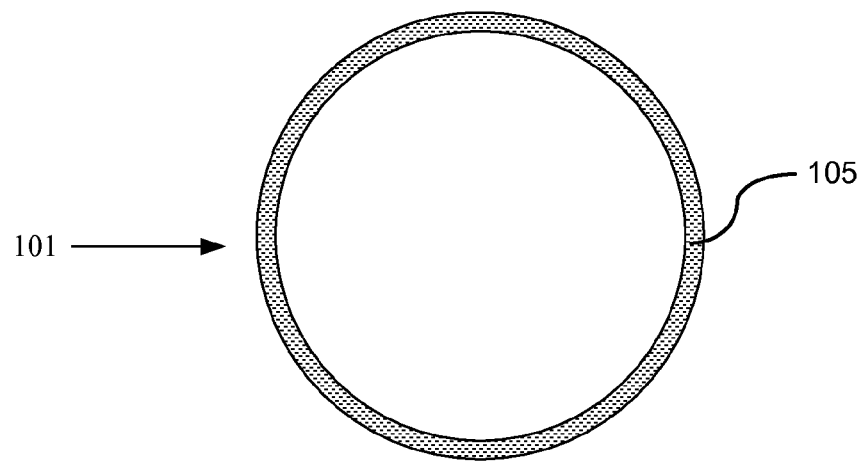

To facilitate understanding the concepts of this invention, a schematic illustration of a semiconductor wafer is shown in FIG. 1. As shown, such semiconductor wafer has a top or "front" side 100 and a "backside" 101. The wafer also has an interior "active circuit region" 102 where integrated circuit devices with associated conductive metal routes are formed. To make maximum use of expensive semiconductor material, this active circuit region should constitute a high fraction of the area on the front side 100 of the wafer. With a 200 mm wafer, the PEM apparatus mentioned above allows the interior active surface region to extend the useable active region to within at least 1.5 and 4 mm of the outer boundary of the wafer. As shown, integrated circuit wafers also include a "front edge" area 103, which is the region on the front of the wafer that lies outside the active circuit region, a "side edge" area 104 (sometimes referred to herein as an "edge bevel region") and a "back edge" area 105. The side edge lies in the area between the front side and the backside, and the back edge is roughly the area near the outer boundary of the wafer on its backside, approximately analogous to the front edge area. Unwanted metal such as copper may deposit on regions 103, 104, and 105. Some metal may also deposit over the entire backside 101. The PEM apparatus described above removes unwanted metal from these regions without substantially affecting metal deposited on active region 102. Methods described herein can be used in virtually any post electrofill process that uses deionized water flow for example to rinse a wafer or as a solvent in reagents used in the post electrofill process, for example, etchants and the like.

A PEM as referred to in this invention is a module that is specifically designed to carry out the edge bevel removal (EBR) process, as well as a backside etch (BSE) process, in most cases. One example of a PEM apparatus that addresses the aforementioned concerns is available from Novellus Systems, Inc. of San Jose, Calif. and described in U.S. Pat. No. 6,333,275, "ETCHANT MIXING SYSTEM FOR EDGE BEVEL REMOVAL OF COPPER FROM SILICON WAFERS" naming Steven T. Mayer et al. as inventors, and filed Apr. 25, 2000, which is herein incorporated by reference in its entirety. It may also perform processes ancillary to the actual EBR, including pre-rinsing, rinsing, acid washing and drying, and it may also be referred to as a cleaning station. In some embodiments the cleaning station consists essentially of a wafer holder (e.g., a wafer chuck), and one or more ports and nozzles and an associated delivery mechanism, as described in the U.S. Pat. No. 6,333,275 previously incorporated by reference. At least one nozzle in the cleaning station is configured to deliver the heated and degassed deionized water flow to a wafer. Methods and apparatus described herein augment apparatus such as PEMs by conditioning the deionized water flow that feed such apparatus. The conditioned water, specifically degassed and/or heated, significantly improves post electrofill processing to an unexpected level. Wafer rinsing and drying is faster and post electrofill reagents, for example, etchants, work more efficiently. "Degassed" includes removal of any gases from the deionized water flow that are entrapped, for example, oxygen and carbon dioxide.

A typical Damascene process for making integrated circuits begins with formation of line paths etched as trenches and vias in a blanket layer of dielectric such as a silicon dioxide wafer. These trenches and vias define conductive routes between various devices on a semiconductor wafer. Because copper or other mobile conductive material provides the conductive paths of the semiconductor wafer, the underlying silicon devices must be protected from metal ions (for example, copper) that might otherwise diffuse into the silicon. To accomplish this, the process includes depositing a thin diffusion barrier layer before depositing the metal. Suitable materials for the diffusion barrier layer include tantalum, tantalum nitride, tungsten, titanium, and titanium tungsten formed for example by a PVD process such as sputtering. A copper seed layer is typically applied on the barrier layer, for example, via PVD, so there is a sufficient conductive film for electroplating the copper inlay. The wafer is then electrofilled with a thicker layer of copper over the seed layer, by electroplating. The copper is deposited to a thickness that completely fills the various line paths and vias in the dielectric layer.

As mentioned, it is desirable to use as much of the wafer surface for active circuitry as possible. While it is generally a straightforward matter to shield unwanted areas from an electroplating solution, the same kind of shielding cannot be so easily and precisely done with PVD, which as mentioned is typically used for the seed layer. Thus deposition of PVD copper in some unwanted areas cannot be avoided. This copper must be removed, and this is accomplished by EBR and/or BSE processes, where, for example, a viscous copper etchant is applied to the front edge of the wafer in a thin stream. The etchant flow is viscous so that it remains in a thin layer near the region of application, and thus avoids contact with the interior (for example surface 102 as in FIG. 1) of the wafer. Because the etchant is applied with a radial velocity component, and because of the centripetal acceleration effects of the rotating wafer, the thin viscous layer flows outward and down over the edge and a few millimeters onto the wafer backside, thus accomplishing removal of the PVD copper from all three of these areas. After EBR, the electroplated copper is planarized, generally by chemical-mechanical polishing (CMP) down to the dielectric in preparation for further processing, generally the addition of subsequent dielectric and metallization layers in an iterative process.

Electrofill systems may include a PEM, such as the Novellus PEM mentioned above. These PEM's may be employed to perform each of the following functions: edge bevel removal, backside etching, and acid cleaning of wafers after they have been electrofilled as described above. Gaseous nitrogen is provided for delivery directly onto a wafer during processing. This enables blowing dry, particle-free nitrogen at the center, upper face of the wafer. Such integrated systems include filtering units, electronics and power units as well as chemical dilution modules for mixing etchants and acid cleaners, and electroplating solution. PEM subsystems in particular also include ports and nozzles for the various liquid and gaseous streams used during etching and cleaning. All of the chemical units utilize a flow of high purity deionized water. The source of deionized water typically originates with a central source within a FAB.

Figure 2:
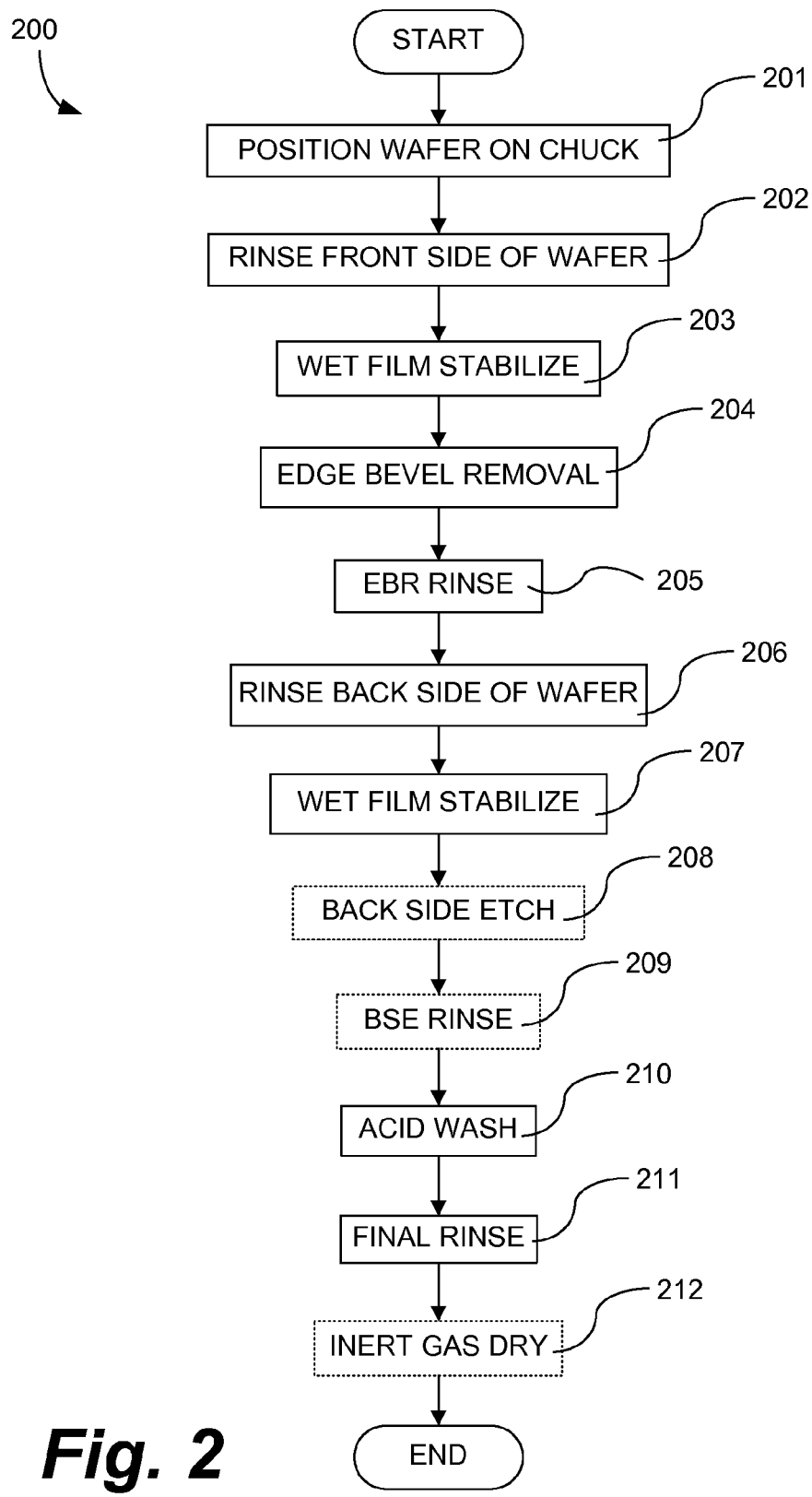
FIG. 2 is an exemplary process flow outlining a post electrofill process where methods and apparatus described herein are particularly useful.

To aid in understanding the context and benefits of the invention, an EBR process which incorporates methods described herein is illustrated in FIG. 2. The process begins at 201, where the wafer is positioned on a chuck for EBR processing. Deionized water is applied to the front of the wafer and the wafer is spun at about 200 to about 400 rpm in order to pre-rinse the wafer of any particles and contaminants left over from previous processing. With the conditioned DI water described herein, pre-rinse typically take only a few seconds. In one embodiment, pre-rinse takes between about 1 second and about 30 seconds, in another embodiment pre-rinse takes between about 2 seconds and about 10 seconds, in another embodiment pre-rinse takes between about 3 seconds and about 5 seconds, and in another embodiment pre-rinse takes about 4 seconds.

The deionized water is then turned off and the wafer is spun up to a speed of between about 100 and about 800 rpm, which creates a uniformly thin layer of deionized water (wet-film stabilization). See 203. This wet-film stabilization facilitates an even distribution of the etchant over the front side of the wafer. In one embodiment the wafer is spun at between about 200 rpm and about 500 rpm, in another embodiment at between about 350 rpm and about 450 rpm, in yet another embodiment at about 400 rpm.

After wet-film stabilization 203, removal of the edge bevel metal 204 is performed. The EBR etchant is typically applied to the surface of the wafer using a thin tube which has a nozzle opening at or near its end. During EBR, some etchant may flow onto the backside edge of the wafer and etch it. After the required amount of liquid etchant has been applied to the front edge of the wafer, deionized water is again applied to the front side of the wafer as a post-EBR rinse 205. This application of deionized water will generally continue through the subsequent operations of backside etching and backside rinsing so as to protect the wafer from any extraneous backside etchant spray and damage.

At generally about the same time as commencement of step 205, the backside of the wafer is pre-rinsed 206 with deionized water, which is wet-film stabilized 207 as was described above in relation to the front side rinse and wet-film stabilization. After the flow of deionized water to the wafer backside ends, a backside etch operation 208 is optionally performed, generally with the same etchant that was used for the EBR. This etchant then disperses over the entire backside of the wafer. The purpose of BSE is to remove any residual copper that was formed on the backside of the wafer during formation of the seed layer of PVD copper, although etchant that flows from the front to the backside as described in the front side etch step may be sufficient to remove backside copper—this obviates the need for a separate back side etch step.

After front side clean FSE and/or BSE, both sides of the wafer (or at least the front side of the wafer) are rinsed with deionized water to rinse any liquid etchant, particles and contaminants remaining from FSC and/or BSE. See 209. Then front side clean, FSC, is performed where a flow of deionized water to the front side ends and a dilute acid, generally less than about 15% by weight acid, is applied to the front side of the wafer to remove residual metal oxide and remove the associated discoloration. See 210. After the acid rinse, deionized water is once again applied to both sides of the wafer, or at least the front side, to rinse the acid from the wafer. See 211.

With the conditioned DI water described herein, final rinses typically take only a few seconds. Some final rinse methods call for a single rinse step. In one embodiment, final rinse takes between about 1 second and about 45 seconds, in another embodiment final rinse takes between about 2 seconds and about 10 seconds, in another embodiment final rinse takes between about 2 seconds and about 5 seconds. In one embodiment the wafer is spun at between about 100 rpm and about 1300 rpm, in another embodiment at between about 200 rpm and about 600 rpm, in yet another embodiment at about 500 rpm.

Some final rinse methods include a two step procedure, where the wafer is rinsed for a period at a specified rpm or range of rpm, and then rinsed for a second period at another rpm or range of rpm. Higher rpm rinses provide improved reflectivity, but typically after EBR, BSE and FSC there is still acid on the wafer. A two step rinse, where the first step is a lower rpm than the second step, is advantageous because it is important to remove the majority of the acid wash at a lower rpm to avoid splashing which can cause defects, for example, streaks caused by acid splashing back into the center region of the wafer. After the first rinse step at lower rpm where most of the acid is removed without splashing, then the wafer is rotated at a higher rpm second rinse step. In one embodiment, the final rinse includes a first step where the wafer is rinsed for between about 1 second and about 5 seconds at between about 300 rpm and about 500 rpm, and a second step where the wafer is rinsed for between about 5 seconds and about 10 seconds at between about 400 rpm and about 600 rpm. In another embodiment, the final rinse includes a first step where the wafer is rinsed for between about 2 seconds at about 400 rpm, and a second step where the wafer is rinsed for about 6 seconds at between about 500 rpm.

Finally the wafer can be spun and optionally blow-dried (for example with inert gas on one or both sides), as desired. See 212. Generally, any drying step is carried out at about 750 and about 2000 rpm for about 10 to about 60 seconds. The conditioned deionized water flow described herein allows for faster drying times, making an inert gas dry step optional. In one embodiment there is no inert gas blow drying step. Typically, using conditioned DI water described herein, drying the wafer without the inert gas blow-dry can take as little as about 10 seconds to about 15 seconds whereas with traditional drying using ambient temperature DI that has not been degassed, drying takes about 25 seconds, even with inert gas blow-dry, on average about twice as long using conventional systems. When processing many wafers, the seconds saved add up to significant amounts of time which translates into much higher throughput. In one embodiment, the drying step takes between about 10 seconds and about 45 seconds, in another embodiment between about 15 seconds and 25 seconds, and in another embodiment about 15 seconds. After this processing in the PEM is completed, a robot arm picks up the wafer and puts it in a cassette.

Figure 3A:
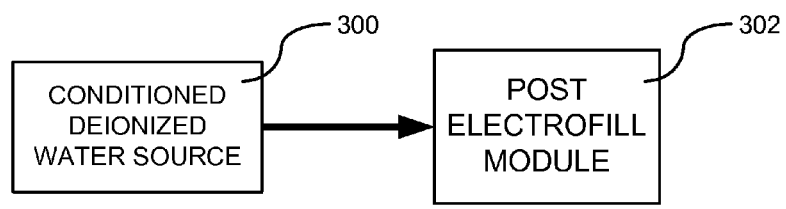
FIGS. 3A and 3B are schematics showing apparatus described herein.
Figure 3B:
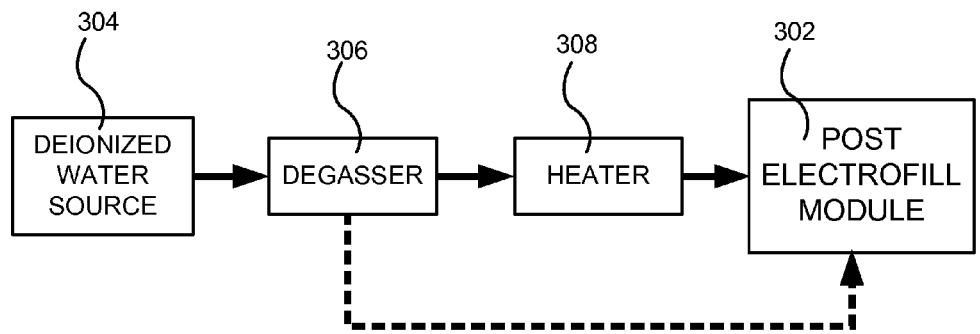

One aspect of the invention is an apparatus for conditioning a deionized water flow, including: a degassing station configured to remove dissolved gas from the deionized water flow; a heating station configured to heat the deionized water flow; and a nozzle configured to deliver the deionized water flow to a wafer. Optional dilution modules may contain one or more tanks for mixing reagents with deionized water, either degassed or degassed and heated. FIGS. 3A and 3B are schematics showing apparatus described herein in a broad sense as they relate to PEM's. Referring to FIG. 3A, apparatus described herein condition a deionized water flow to produce a source of heated and degassed deionized water, see 300. The conditioned deionized water is used in a PEM, 302, to carry out the processes as described above. As mentioned, it has been found that by heating and degassing deionized water used in PEM's, many benefits are realized, including faster wafer rinsing and drying as well as higher throughput.

Deionized water flows for rinsing wafers in PEM's are conventionally room temperature flows. At room temperature, rinsing often takes longer to be effective, but defect levels rise as a result of longer rinse times. It has been discovered that simply heating deionized water to decrease rinse and dry times is not effective, because although hotter water allows for shorter rinse times, it also results in higher levels of defects. While not wishing to be bound to theory, this is presumably due to higher levels of copper oxidation on the wafer surface due to oxygen in the water and a higher rate of oxidation due to the higher temperature. Degassing is necessary to return oxidation levels to acceptable levels by removing adventitious oxygen from the heated deionized water prior to application to the wafer. Degassed water, heated or not, is also advantageous as a more highly pure solvent for mixing reagents used in PEM's, for example, etchants and acid wash reagents. The invention provides for shorter rinse times and less defects.

A typical, but not limiting, embodiment of an apparatus described herein is depicted in FIG. 3B. A deionized water source, typically but not necessarily a centralized source from a FAB, is used to feed apparatus described herein, see 304. The deionized water flow from source 304 is passed through a degasser, 306, primarily to remove oxygen as described above. The degassed deionized water flow is then passed through a heater, 308, in order to heat the water to a specified temperature. It has been found that the water temperature used to rinse and/or prepare reagents for post electrofill processes is important as described in more detail below. For example, the degassed deionized water may be used in one or more dilution modules without the heating step. After the deionized water flow is both degassed and heated, it is ready for use in PEM 302 for application to one or more wafers. One of ordinary skill in the art would recognize that the deionized water may be first passed through the heater prior to a degasser, or the water may be heated and degassed concurrently in a single station, these are also embodiments of the invention. Optionally, in one embodiment, the degassed deionized (unheated) water can also pass directly to the PEM, as indicated by the dashed arrow, for use in preparing reagents used in the PEM.

Figure 4:
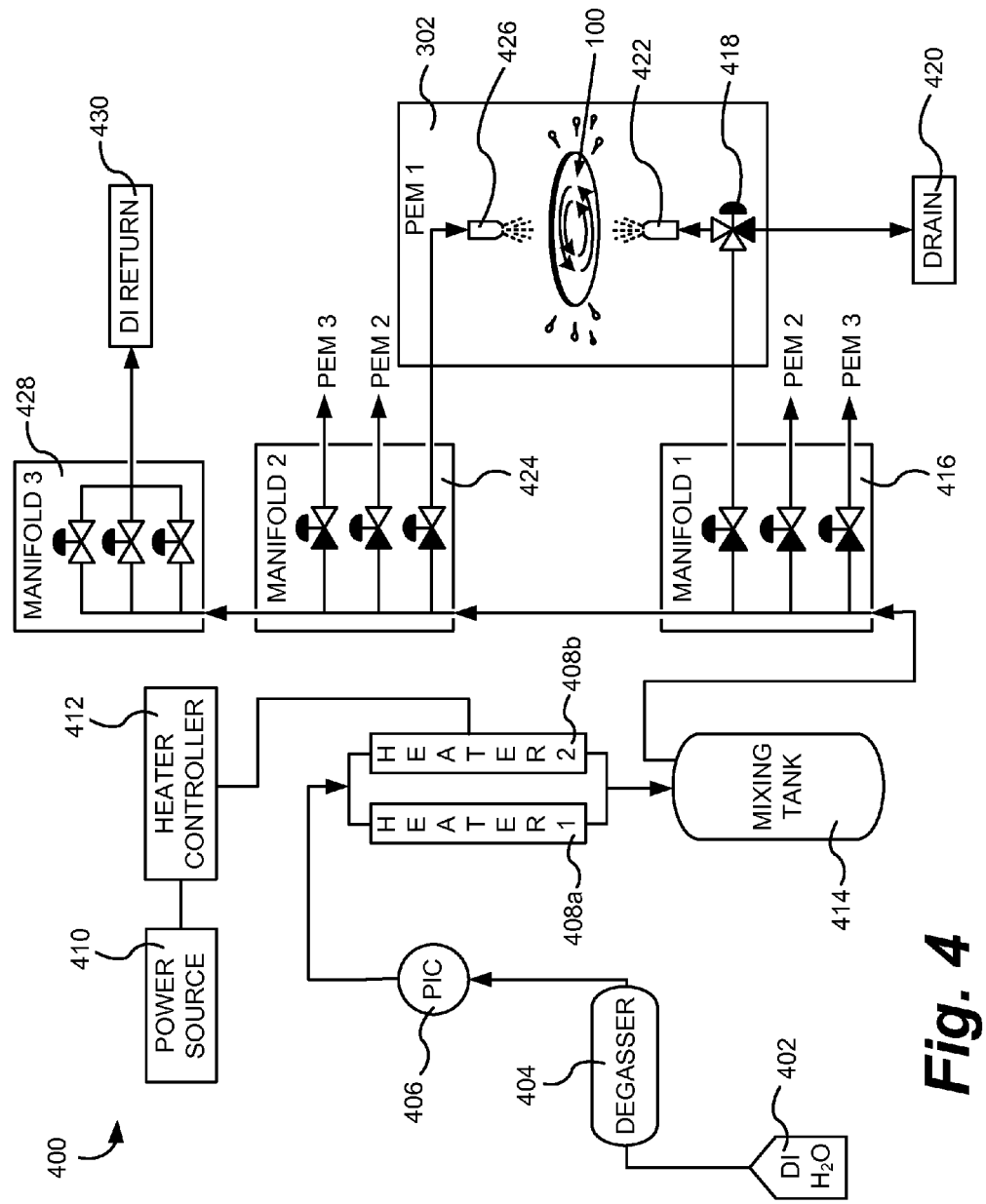
FIG. 4 is a schematic representation of a particular apparatus described herein.

FIG. 4 depicts a more specific embodiment of apparatus described herein, a deionized water conditioning system 400. A deionized water source, again typically from a FAB, is in fluid communication with a degasser 404. The degasser is an apparatus that removes unwanted gases from a fluid medium. Typically, the fluid medium is a flow of the fluid passing through the degasser, in this case, a deionized water flow from a FAB. The degassing station may be any apparatus that removes oxygen from the deionized water flow.

In one embodiment, the degassing station includes at least one of a contactor and an inert gas bubbler. As mentioned above, FAB's typically have a source of inert gas such as nitrogen or argon for use in for example the PEM. An inert gas bubbler is an apparatus utilizing a flow of one or more inert gases passed through, for example, bubbled, a fluid medium to entrap and carry off other gases dissolved in the fluid medium. In the context of the invention, one or more inert gases are passed through the deionized water flow to remove unwanted oxygen. The term "inert gas bubbler" is not meant to be limited to systems that bubble gas through the deionized water, but rather to mean any apparatus that uses one or more inert gases to remove unwanted oxygen from the deionized water flow. An inert gas bubbler may be used alone or in combination with a contactor.

A contactor is an apparatus that removes gases from a fluid flow, for example, by subjecting the fluid flow to a differential pressure across a gas permeable membrane where the unwanted gas passes through the membrane and thus the fluid flow is purified. Another example of a contactor uses an absorptive medium with a high affinity for the unwanted gas in contact with the membrane surface opposite the surface in contact with the fluid flow (rather than a differential pressure across the semi-permeable membrane). The term "contactor" as used in the context of the invention is meant to include any gas removal system or apparatus that uses semi-permeable membrane technology. One contactor well suited for apparatus and methods described herein is the model G491 contactor, available from Membrana, a division of Celgard Inc. of Charlotte, N.C.

Figure 5A:
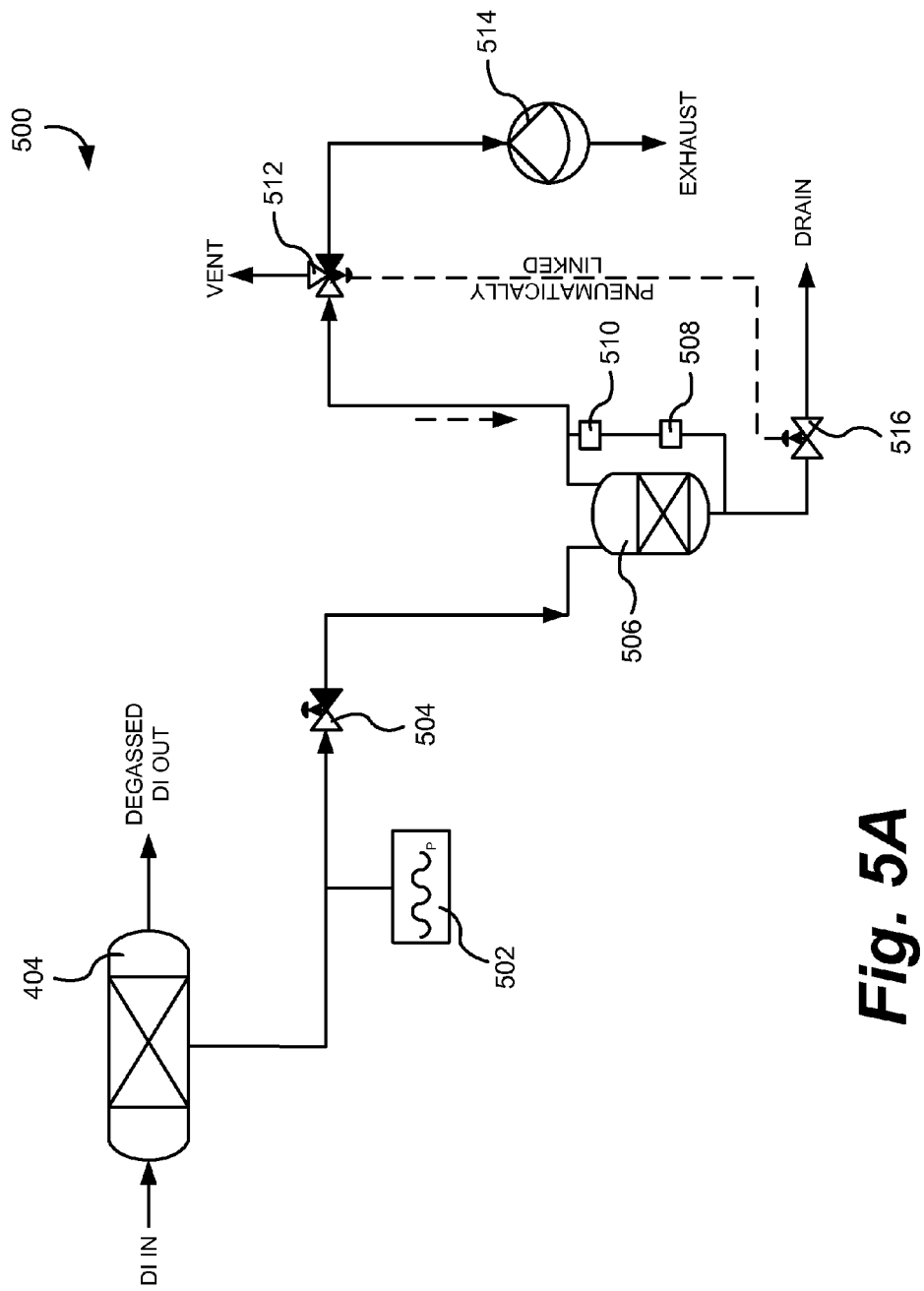
FIG. 5A is a schematic depicting particular features of a contactor used in the apparatus described herein.

An example of a degasser, 404, in this case a contactor with its supporting components, is depicted in FIG. 5A. Degasser 404 allows a deionized water flow to pass through it, and while passing through, the deionized water flow is degassed. Degasser 404 is the type that utilizes a differential pressure across a semi-permeable membrane. Degasser 404 is piped to a vacuum pump, 514, which supplies vacuum to create the differential pressure. The vacuum side of the contactor is at least a partial vacuum and may also include a gas, for example, and inert gas such as $N_2$. Inert gas on the vacuum side of the membrane improves the degassing performance as it increases the differential partial pressure of oxygen across the membrane. The inert gas allows for flow that sweeps the residual oxygen molecules from the vacuum side, although vacuum alone across the membrane is sufficient. A pressure gauge, 502, monitors pressure in the line. A separator, 506, is used to trap water vapor that passes through the semi-permeable membrane of the contactor and periodically empty to a drain via valve 516, as instructed via a controller (not shown) using feedback from an overflow sensor 510 and a drain sensor 508. Drain valve 516 is pneumatically linked to a vent/vacuum valve 512; when the system is draining separator 506, both the drain valve and vent valve are open, and the vacuum is isolated from the degasser plumbing and the degasser is isolated from the separator subsystem as well via valve 504. During typical operation of apparatus described herein, the separator system is drained only for a short period, on the order of seconds, and then vacuum is restored to the contactor. Draining the separator typically is performed while the PEM temporarily doesn't need conditioned deionized water flow for an operation.

Figure 5B:
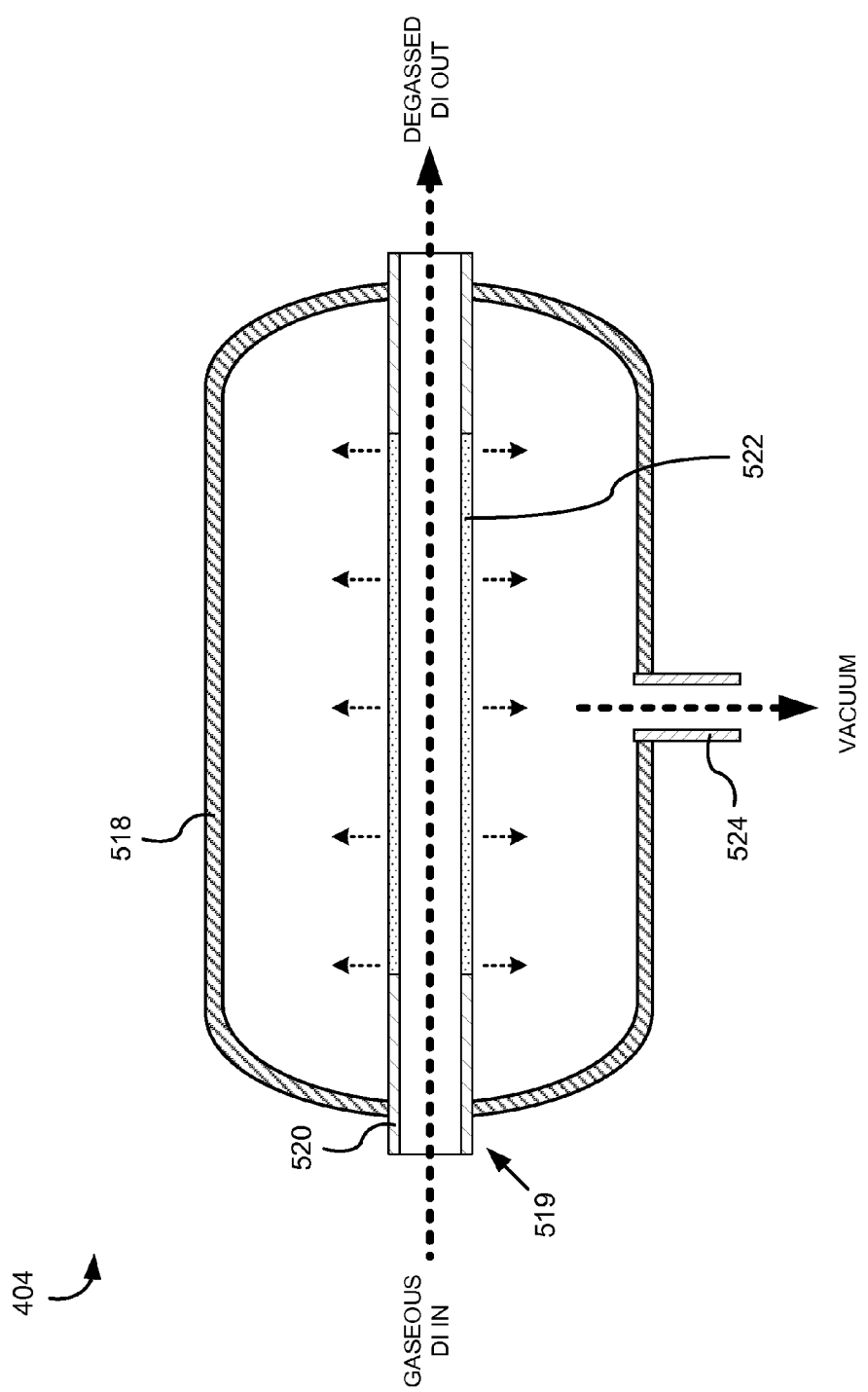
FIG. 5B is a cross section showing some particular features of the contactor of FIG. 5A.

FIG. 5B depicts a cross section of degasser 404 showing with more particularity the subcomponents of a contactor. Degasser 404 has a chamber 518 and a tube 519 that traverses the chamber which is comprised of two materials, a highly impermeable material 520 and a semi-permeable membrane 522 which allows oxygen gas to pass through it. Membranes used in such apparatus and methods should be highly permeable, preferably having a microporous structure. Because of the high density of pores and the high packing density of membrane surface area, a very large interfacial area can be obtained in very small physical packages. Vacuum inlet 524 provides a pressure differential across membrane 522, by virtue of created a partial vacuum in chamber 518, which pulls gas, for example, oxygen, out of the deionized water flow passing through tube 519.

Referring again to FIG. 4, once the deionized water flow is degassed it travels to a heating station for heating to the appropriate temperature. In one embodiment, there are one or more dilution modules (not depicted in FIG. 4) upstream of the heating station where reagents are mixed with the degassed deionized water to make solutions used in the PEM.

These solutions, for example, etchants, cleaners and the like, typically but not necessarily, bypass the heating station for application to the wafer. In one embodiment, these solutions are further diluted downstream (but before delivery to the wafer) for example by combining with a flow of deionized water, conditioned or not.

In the example apparatus in FIG. 4, the degassed deionized water passes to the heating station. In one embodiment, the heating station delivers the deionized water flow at a temperature of between about 30° C. and about 80° C., in another embodiment between about 30° C. and about 50° C., in yet another embodiment between about 35° C. and about 40° C. In one embodiment, the heating station delivers the deionized water flow at a temperature of about 38° C. In the example in FIG. 4, the heating station includes two parallel flow inline heaters, 408a and 408b, but the invention is not limited to this particular configuration. Heaters 408a and 408b are controlled via heater controller 412 which is powered by a power source, 410. Heater controller 412 uses feedback from valves in system 400 to heat the deionized water based on demand. Direct flow rate information could also be used without escaping the scope of the invention.

A pressure indicating controller, 406, may also be used to control flow from the degasser to the heater to maintain a desired pressure. In one embodiment, the deionized water flow is maintained at a pressure of between about 40 psig and about 80 psig, in another embodiment between about 40 psig and about 60 psig, in yet another embodiment about 50 psig.

After the deionized water flow is degassed and heated, it moves to a mixing tank, 414. Mixing tank, or station, 414 is configured to receive the deionized water flow from, in this example, the two parallel flow inline heaters, mix the deionized water flow, and deliver the deionized water flow at substantially constant temperature water to at least one of a wafer and a dilution module, for example, as part of a PEM, 302, (indicated as "PEM 1"). As mentioned, dilution modules can be upstream of the heater, where degassed deionized (unheated) water is supplied to one or more dilution modules. In this example, only one PEM is depicted, but apparatus described herein can serve multiple PEM's with the appropriate plumbing and control mechanisms, as would be appreciated by one of ordinary skill in the art. In one embodiment, water conditioning apparatus described herein serve three PEM's (as indicated by "PEM 2" and "PEM 3" in FIG. 4). In a typical configuration, more than one PEM is served but not simultaneously, rather asynchronously, for example, with a phase lag between wafer loads.

Figure 6:
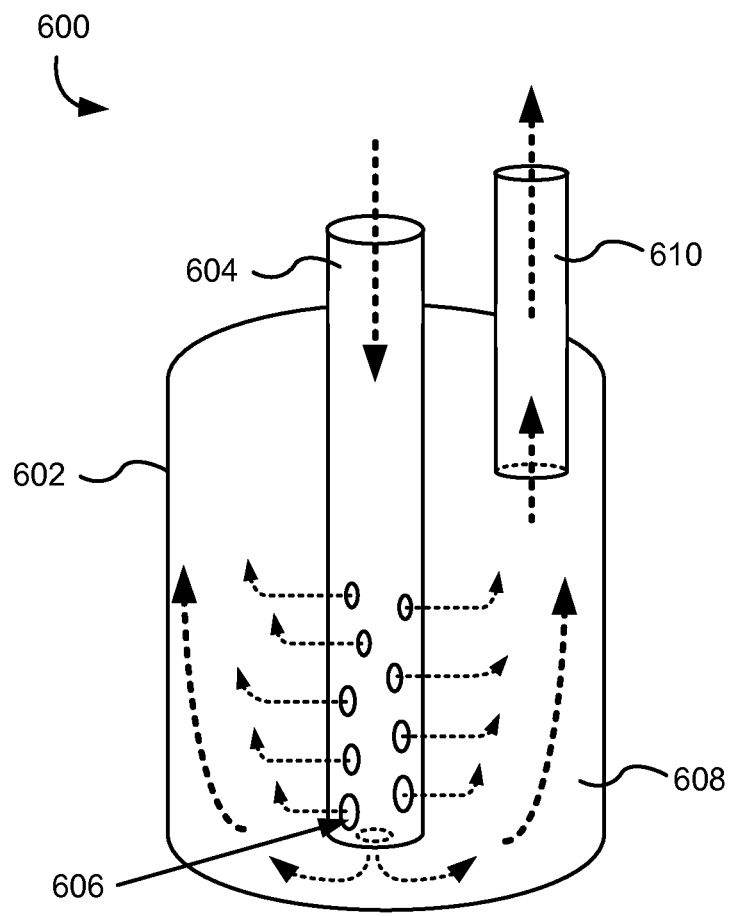
FIG. 6 is a schematic representation of a mixing station described herein.

FIG. 6 depicts an exemplary mixing station, 600. In this example, mixing station 600 has a tank, 602, and an inlet tube, 604, where the degassed and heated deionized water flow enters the tank. The water passes down the inlet tube and exits the tube via a plurality of apertures, 606, which are the only outlets from tube 604. A reservoir of deionized water, 608, is maintained in tank 602 so that water exiting apertures 606 (as indicated by the smaller dashed arrows) mixes with the reservoir of water in the tank. Note, in this particular configuration, the apertures 606 are progressively larger as a function of distance down the length of tube 604. Also, there is an aperture in the bottom of tube 604 to further aid mixing. The holes are progressively larger so as to maintain a substantially constant volume flow rate from each aperture. The overall flow pattern in the tank is bottom up as indicated by the heavier curved dashed arrows. Preferably, tank 602 is filled with reservoir 608, that is, there is no head space filled with gas, no water/gas interface. The mixed water exits the mixing station via outlet 610. Mixing stations are not required in apparatus described herein, but in the case that the heated water, for example, comes from multiple heating unit streams, it is adventitious to remix the streams to maintain a substantially constant water temperature for delivery to the PEM. In another example, the mixing station is used to suppress fluctuations in temperature resulting from variations in flow rate as rinse nozzle valves open and close.

Referring again to FIG. 4, once the deionized flow leaves the mixing tank it is delivered to PEM 302. It is advantageous to configure the deionized water conditioning apparatus described herein in close proximity to the PEM's so as to minimize heat loss in the plumbing prior to application of the water flow for its intended purpose. Apparatus 400 includes: a first valve manifold, 416, configured to deliver the deionized water flow to a first plurality of spray heads, 422, via a first plurality of valves as depicted; a second valve manifold, 424, configured to deliver the deionized water flow to a second plurality of spray heads, 426, via a second plurality of valves as depicted; and a third valve manifold, 428, which includes a third plurality of valves, the third valve manifold configured to provide a pressure feedback control to at least the first valve manifold (and/or the second manifold) and deliver the deionized water flow to a return line for recirculation to the FAB. As depicted, manifold 416 has three valves, each delivers to a spray head, 422. Two of spray heads 422 are not shown, as they are part of PEM 2 and PEM 3, respectively, each analogous to PEM 1 as drawn—each delivering water to the front side of a wafer. Also, manifold 424 has three valves, each delivers to a spray head, 426. Two of spray heads 426 are not shown, as they are part of PEM 2 and PEM 3, respectively, each analogous to PEM 1 as drawn—each delivering water to the back side of a wafer. One of ordinary skill in the art would recognize that apparatus described herein can deliver conditioned deionized water to one or more spray heads in a single PEM or multiple PEM's.

Referring again to FIG. 4, in the PEM water can be delivered to the front side, 100, of a wafer, for example, shown in rotation; the back side of the wafer or both concurrently. One spray head configuration delivers the conditioned deionized water as a thin "fan" that spreads out over the inner three-quarters of the wafer diameter. The spray can impact the wafer with a velocity in the same direction as the wafer is rotating, or opposite the direction of rotation, or even in both directions if the spray fan crosses the wafer center. Preferably, the spray is directed opposite to the direction of rotation to increase convective mixing. Alternatively, a simple stream of deionized water can be directed at the center of the wafer (or any other location on the wafer).

As mentioned, manifold 416 delivers the deionized water flow to the front side of the wafer. In this example, manifold 416 feeds to valve, 418, in the PEM that allow conditioned water to drain (see 420) momentarily just prior to application to the wafer. Each of PEM 1, PEM 2 and PEM 3 have an analogous valve 418. Each valve 418 is part of a diverter valve manifold, downstream of the first valve manifold, 416, configured to drain the deionized water flow in order to maintain the temperature of the deionized water remaining in the apparatus for delivery to one or more spray heads. By employing such a diverter manifold, maintaining a recirculation loop at the PEM is avoided. The degassed-heated deionized water flow could be recirculated as part of apparatus without escaping the scope of the invention, but it is convenient and cost saving to simply drain a portion of the conditioned water just prior to application to maintain the desired temperature in the lines, rather than incur the extra cost of a recirculation system and requisite additional heat and valve control and maintenance requirements. As will be discussed in further detail below, there is an overall net savings of water by using the deionized conditioning apparatus described herein. Tighter temperature control of the water flow at the front side of the wafer is typically more desirable than at the back, however, one embodiment is an apparatus that has this diverter manifold or a recirculation loop system serving the spray heads at both the front and back of the wafer.

As mentioned, the third valve manifold, 428, which includes a third plurality of valves, is configured to provide a pressure feedback control to at least the first valve manifold and deliver the deionized water flow to a return line for recirculation to the FAB, see 430. When the PEM's are not drawing from the conditioned deionized water flow, then manifolds 416 and 424 are closed, allowing the flow to return to the FAB via manifold 428. In one embodiment, pressure feedback control is provided via slaving the third plurality of valves in manifold 428 to a corresponding first plurality of valves and the second plurality of valves, whereby the third plurality of valves are closed when the first plurality of valves and/or the second plurality of valves are open. This feedback control allows proper pressure to be maintained in the flow lines during operations of the PEM's that require degassed-heated deionized water and provides modest water savings as part of the apparatus described herein.

Another aspect of the invention is a post electrofill process including: degassing a deionized water flow; heating the deionized water flow to between about 30° C. and about 50° C.; and using the deionized water flow for rinsing a wafer. As mentioned, in one embodiment, degassed deionized (unheated) water is used as a solvent, for example, where mixing with a reagent would create an exotherm, for example, with sulfuric acid dilution. In these processes, the water is used post-degassing and prior to heating. In another embodiment, the degassed heated deionized water is used to prepare reagents in a dilution module as described herein.

Figure 7A:
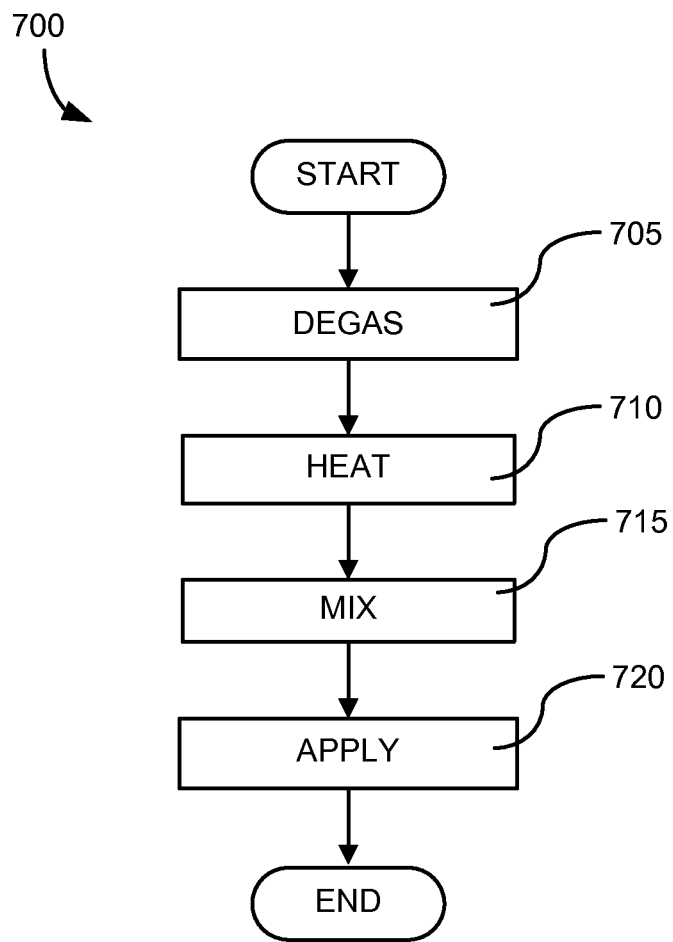
FIG. 7A is a process flow of a method described herein.

Another aspect of the invention is a method of conditioning a deionized water flow for use in post electrofill processing, including degassing the deionized water flow; heating the deionized water flow; and delivering the deionized water flow to a wafer. It is not necessary that the water be degassed prior to heating. One of ordinary skill in the art would appreciate that the water flow can be heated, then degassed, or degassed and heated concurrently. FIG. 7A depicts a process flow, 700, in accord with methods described herein. A deionized water flow is degassed, see 705. In one embodiment, degassing the deionized water flow includes at least one of passing the deionized water flow through a contactor and bubbling an inert gas through the deionized water flow. The degassed deionized water may be diverted to one or more dilution modules when needed, and/or passed through a heating station.

The degassed deionized water is then heated, see 710. In one embodiment, the deionized water flow is heated to between about 30° C. and about 80° C., in another embodiment to between about 30° C. and about 50° C., in another embodiment between about 35° C. and about 40° C., and in yet another embodiment to a temperature of about 38° C. In one embodiment the water flow is then mixed to ensure uniform temperature, see 715. The mixing step is optional, and depends on the particular need, for example, as where the flow is divided among individual heating elements or heaters. In one embodiment, the deionized water flow is recirculated in a recirculation loop in fluid communication with the mixing station while not being used for application to the wafer. In another embodiment, the deionized water flow is diverted to a drain to maintain the temperature of the deionized water flow just prior to application to the wafer.

Figure 7B:
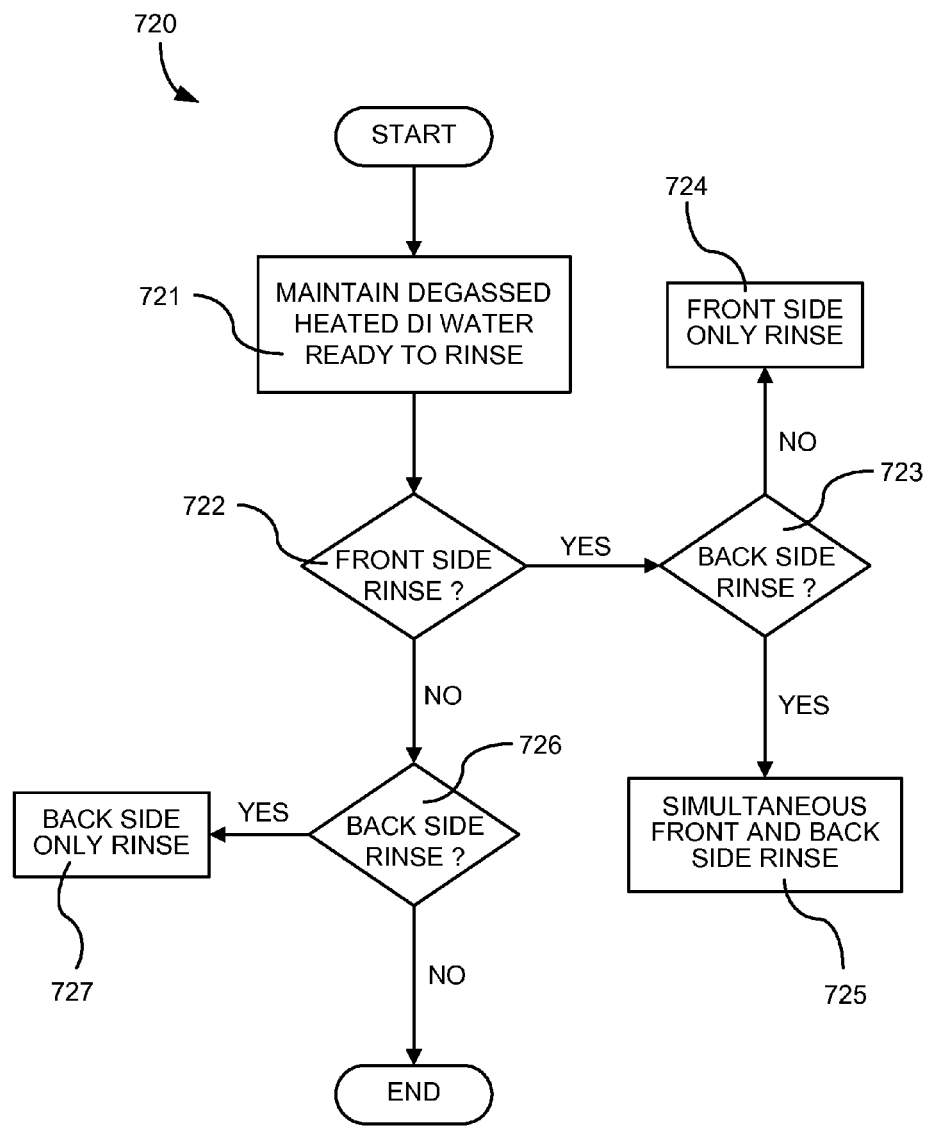
FIG. 7B is another process flow showing particular aspects of the process flow of FIG. 7A.

In one embodiment the deionized water flow is maintained at a pressure of between about 40 psig and about 80 psig, in another embodiment between about 40 psig and about 60 psig, in another embodiment about 50 psig for application to one or more wafers in a PEM, see 720. The deionized water flow is delivered to the front side, the back side, or both the front side and the back side of the wafer concurrently. FIG. 7B depicts a logic flow, outlining further, application 720, of degassed-heated deionized water used in rinsing methods described herein and can be implemented, for example, using apparatus described herein as described above, for example, as implemented by a controller. A flow of degassed-heated deionized water is maintained for use in rinsing processes in a PEM, see 721. A decision is made whether to rinse the front side of the wafer or not, see 722. If the front side of the wafer is to be rinsed, then a decision is made whether to rinse the back side of the wafer, see 723. If the back side is not to be rinsed, then only the front side of the wafer is rinsed, see 724. If the back side of the wafer is to be rinsed, then the front and the back side of the wafer are rinsed concurrently, see 725. Returning to decision block 722, if the front side of the wafer is not to be rinsed, then a decision is made whether to rinse the back side of the wafer, see 726. If the answer is yes, then only the back side of the wafer is rinsed; if the answer is no, then the process is complete.

As described above, apparatus and methods described herein can also be used to deliver degassed deionized water to a dilution module. As used herein, a "dilution module" or "dilution tank" is any apparatus is used to mix chemicals with deionized water to form reagents to be used for post electrofill processes, for example, etchants and acid washes in a PEM. Dilution modules may be part of a chemical dilution module, for example, used for providing liquid etchant to an etching system that etches unwanted copper from a semiconductor wafer. In one example, a chemical dilution module may be characterized by the following features: (a) an acid dilution tank for mixing concentrated acid and water to a specified concentration; (b) a hydrogen peroxide dilution tank for diluting concentrated hydrogen peroxide to a specified concentration; and (c) an in-line mixing area for combining hydrogen peroxide from the hydrogen peroxide dilution tank with diluted acid. In this configuration, mixing occurs principally when hydrogen peroxide and acid are delivered to the etching system. Thus, the module may include a line directly connecting the in-line mixing area to the etching system. In one embodiment, the chemical dilution module includes at least one metering pump (such as a syringe pump) which provides dilute acid and dilute hydrogen peroxide to the in-line mixing region.

EXPERIMENTAL

Figure 8:
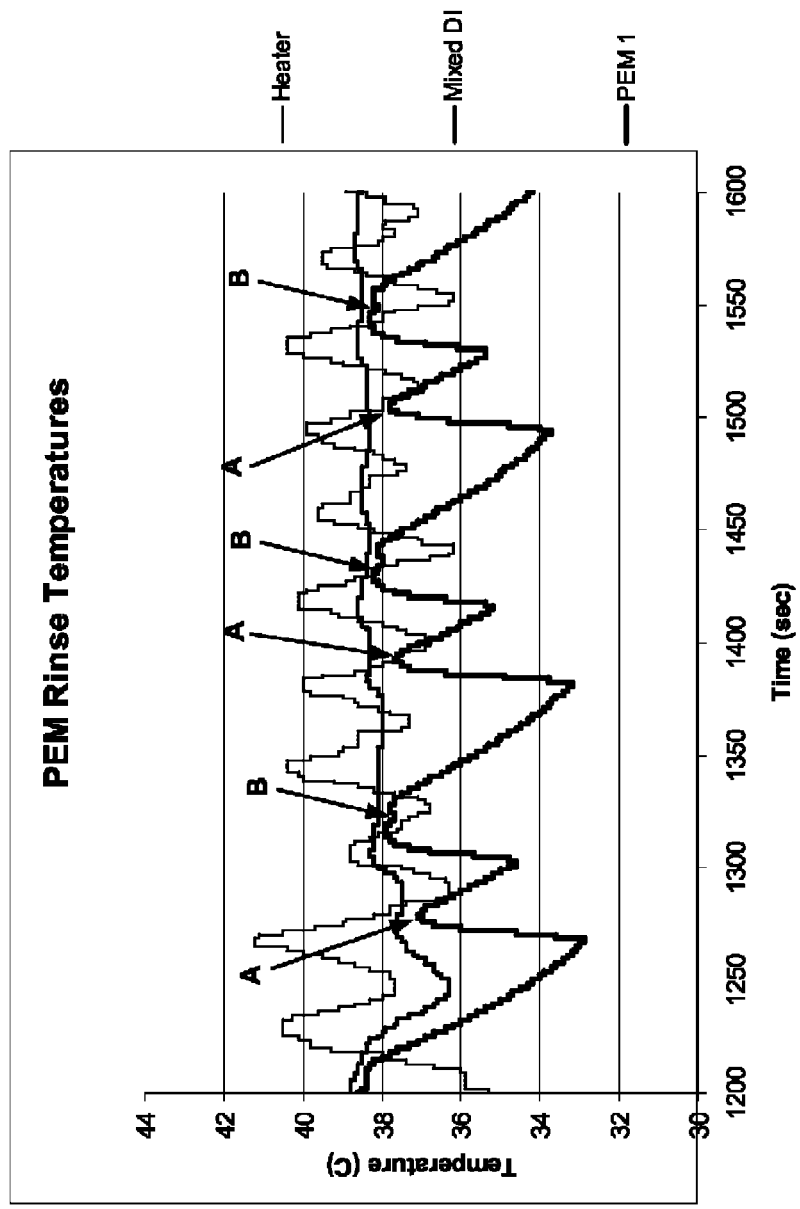
FIG. 8 is a graph showing time vs. temperature for a deionized water flow at various positions in an apparatus described herein during post electrofill processing.

FIG. 8 is a graph showing temperature of a degassed-heated deionized water flow at various points both in a deionized water conditioning apparatus described herein and in a PEM which receives water from the apparatus, similar to that described in relation to FIG. 4. In this example the water is used for rinsing wafers in three PEM's, but only one PEM temperature curve is shown (for clarity). The y axis is water temperature and the x axis is time. First, the water temperature at the heating station (top curve, thinnest line) shows a periodic load on the heater and during which the water temperature rises to about 40° C. on average. The troughs in the heater curve are maintained at about 38° C., the desired temperature for this particular configuration. The next lower curve (medium weight line) is the water temperature exiting the mixing station, this temperature is also maintained at about 38° C., showing that there is tight control of the water temperature, despite periodically feeding the flow to three PEM stations (each out of phase with the others). The next curve (heaviest line) shows the water temperature at the manifold feeding the spray head at the front side of a wafer in PEM 1. In this particular run, BSE is not used, each doublet of peaks (there are three doublets in this curve) shows first the temperature of the water at a prewet step, A, and then the water temperature during rinse, B. At each peak of the curve, the conditioned deionized water is delivered at a substantially constant 38° C. The troughs show that the water temperature at the manifolds drops to between about 31° C. and about 35° C. when not in use. Just prior to use the manifold drains the deionized water flow for a short period as described above to bring the temperature back up to 38° C. for use in the PEM's on the front side of the wafer. In the post electrofill processes where these rinsing regimes were used, it was not as critical to maintain the temperature at the back side of the wafer at 38° C., so the diverter manifold was not necessary. Even so, the temperature at the back side of the wafer averaged about 36° C. Thus, apparatus and methods described herein allow maintenance of a degassed-heated deionized water supply for use in PEM's. In this example, the conditioned water was used for rinsing. By using degassed-heated deionized water, faster rinsing and drying are achieved versus conventional PEM's that use water at room temperature. Even when used only for rinsing, etching and other post electrofill processes are also improved because the wafer remains heated post rinse and dry.

Figure 9:
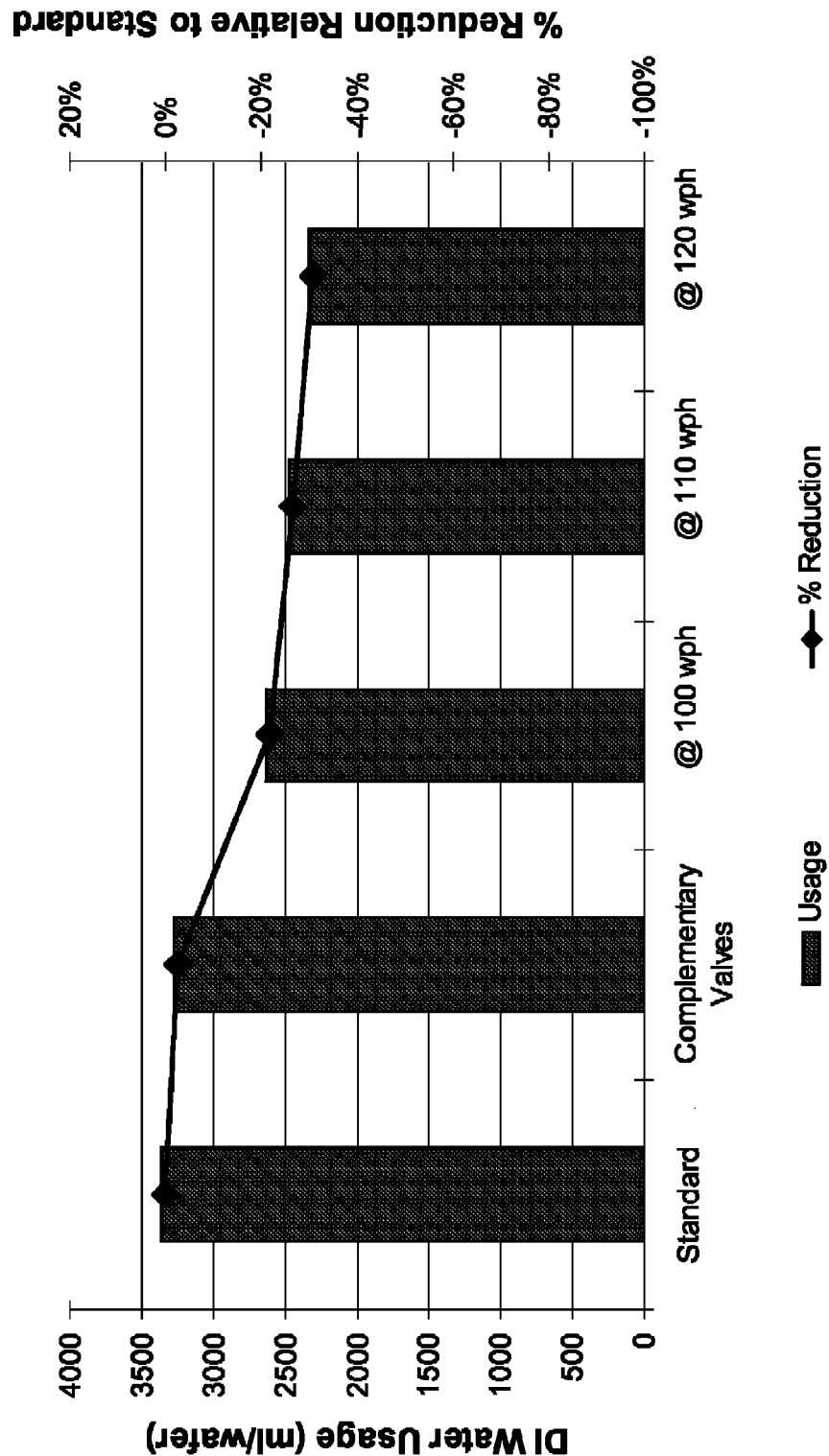
FIG. 9 is a graph showing water usage with and without implementation of methods described herein.

FIG. 9 is a graph showing water savings where the deionized rinses were performed with apparatus and methods described herein using degassed-deionized water at 38° C. relative to the same PEM system using deionized water that was not degassed or heated. The y axis on the left shows deionized water usage in ml/wafer. The y axis on the right indicates the percent water usage relative to standard. The x axis shows five operating conditions. Columns one and two show Standard (i.e. no water conditioning system at 80 wafers per hour (wph)) and Complementary Valves, for example, analogous to third valve manifold 428 described in relation to FIG. 4 (at 80 wph with water conditioning system). Columns three through five show water savings with conditioning hardware at wafer processing rates of 100, 110 and 120 wph. The data show that the complementary valves 428 provide modest water savings, using about 2.4% less water than standard. When apparatus and methods described herein are used including degassed-deionized water flow the savings are significant: running at 100 wpm the system uses 22% less water than standard, at 110 wpm the system uses 27% less water, and at 120 wpm the system uses 31% less water. Thus apparatus and methods described herein provide significant water savings at higher throughputs, a synergistic effect is realized—less water used but more product produced.

While this invention has been described in terms of a few preferred embodiments, it is not limited to the specifics presented above. Many variations on the above-described preferred embodiments may be employed. Therefore, the invention should be interpreted with reference to the following claims.

What is claimed is:

1. A system for conditioning a deionized water flow for processing semiconductor wafers, comprising:
   (a) a degassing station configured to remove dissolved gas from the deionized water flow;
   (b) a heating station configured to heat the deionized water flow;
   (c) multiple nozzles configured to deliver the heated and degassed deionized water to semiconductor wafers, wherein each of said nozzles is positioned in a separate station that is downstream from the degassing station and the heating station;
   (d) a first valve manifold configured to deliver the heated and degassed deionized water flow to each of said multiple nozzles via a first plurality of valves; and
   (e) a second valve manifold comprising a second plurality of valves configured to deliver the heated and degassed deionized water flow to a return line for recirculation to an integrated circuit manufacturing facility when the first plurality of valves are closed, wherein the second plurality of valves are configured to be closed when the first plurality of valves are open.

2. The system of claim 1, wherein the degassing station comprises at least one of a contactor and an inert gas bubbler.

3. The system of claim 2, wherein the deionized water flow is passed through the degassing station before being passed through the heating station.

4. The system of claim 1, wherein the heating station is configured to deliver the deionized water flow at a temperature of between about 35° C. and about 40° C.

5. The system of claim 1, wherein the heating station is configured to deliver the deionized water flow at a temperature of about 38° C.

6. The system of claim 1, wherein the heating station comprises at least two parallel flow inline heaters.

7. The system of claim 6, further comprising a mixing station configured to receive the deionized water flow from said at least two parallel flow inline heaters, mix the deionized water flow, and deliver the deionized water flow at substantially constant water temperature to the semiconductor wafers.

8. The system of claim 1, wherein the apparatus is configured to maintain the deionized water flow at a pressure of between about 40 psig and about 60 psig.

* * * * *